United States Patent [19]

Sakaguchi

[11] Patent Number: 5,801,540
[45] Date of Patent: *Sep. 1, 1998

[54] ELECTRONIC CIRCUIT TESTER AND METHOD OF TESTING ELECTRONIC CIRCUIT

[75] Inventor: Kazuhiro Sakaguchi, Tokyo, Japan

[73] Assignee: NEC Corporation, Tokyo, Japan

[*] Notice: The term of this patent shall not extend beyond the expiration date of Pat. No. 5,659,244.

[21] Appl. No.: 840,701

[22] Filed: Apr. 25, 1997

Related U.S. Application Data

[62] Division of Ser. No. 524,433, Sep. 6, 1995, Pat. No. 5,659,244.

[30] Foreign Application Priority Data

Sep. 21, 1994 [JP] Japan ................................ 6-226314
Feb. 27, 1995 [JP] Japan ................................ 7-38253

[51] Int. Cl.⁶ .......................................... G01R 31/28
[52] U.S. Cl. ...................................... 324/752; 324/751
[58] Field of Search ............................... 324/158.1, 752, 324/765, 71.3, 537; 364/571.01, 550.1; 250/310, 311, 492.2; 356/400, 401

[56] References Cited

U.S. PATENT DOCUMENTS

| | | |
|---|---|---|
| 4,588,950 | 5/1986 | Henley .................................. 324/752 |
| 4,695,794 | 9/1987 | Bargett et al. ......................... 324/751 |
| 4,761,607 | 8/1988 | Shiragasawa et al. .................. 324/752 |
| 4,837,506 | 6/1989 | Patterson .............................. 324/752 |

FOREIGN PATENT DOCUMENTS

| | | |
|---|---|---|
| 0 178 425 | 4/1984 | European Pat. Off. . |
| 0 306 656 | 3/1989 | European Pat. Off. . |
| 540 494 | 9/1973 | Germany . |
| 1 345 767 | 2/1974 | United Kingdom . |
| 2 069 152 | 8/1981 | United Kingdom . |

OTHER PUBLICATIONS

"A Method of Detecting Hot Spots on Semiconductors Using Liquid Crystals"; John Hiatt;CH 1619–6/81/0000–0130, pp. 130–133, 1981; IEEE/PROC. IRPS. (unavailable month).

*Primary Examiner*—Vinh P. Nguyen
*Attorney, Agent, or Firm*—Whitham, Curtis & Whitham

[57] ABSTRACT

A failure analysis equipment for an electronic circuit, includes a voltage supply for supplying a constant voltage to a wiring of an electronic circuit to be analyzed, an energy beam or fluid jet generator, an apparatus for irradiating the energy beam or fluid jet to the wiring to thereby vary a temperature and hence an electrical resistance of the wiring, a detector for detecting a current running through the wiring, and a comparator for comparing the current with a current which is to run if no failure exists in the wiring, thereby determining whether the wiring is in failure or not. As a result a current flow running through a wiring of an electronic circuit to be analyzed may be increased, and make a failure analysis may be conducted without contact to and construction of the electronic circuit.

6 Claims, 11 Drawing Sheets

F I G. 3
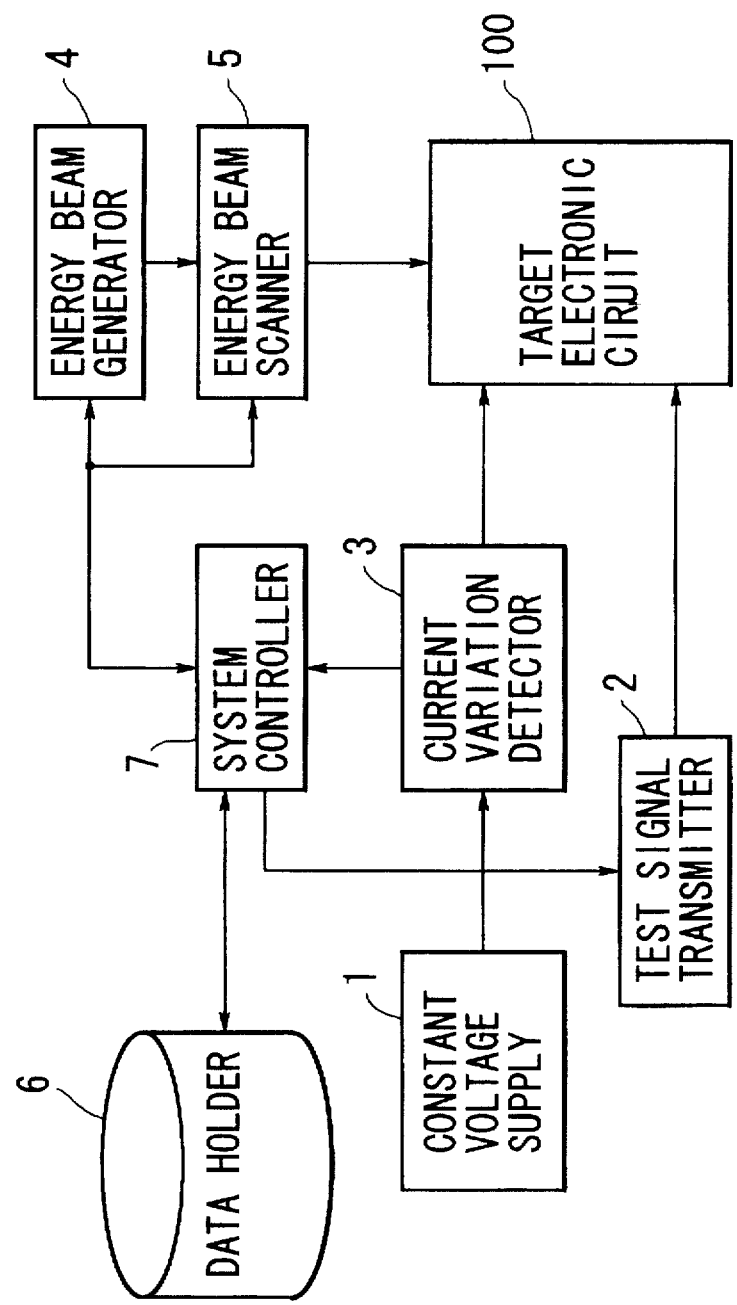

ELECTRONIC CIRCUIT TESTER AND METHOD OF TESTING ELECTRONIC CIRCUIT

CROSS REFERENCE TO RELATED APPLICATION

This application is a divisional of application Ser. No. 08/524,433 filed Sep. 6, 1995, now U.S. Pat. No. 5,659,244.

BACKGROUND OF THE INVENTION

1. Field of the Invention

The invention relates to a failure analysis equipment to be used for an electronic circuit and a method of making a failure analysis in an electronic circuit, and more particularly to such an equipment and method to be used for an electronic circuit arranged on a substrate such as a printed wiring board.

2. Description of the Related Art

If an integrated circuit or an electronic circuit comprising discrete elements such as active elements and passive elements both formed on a substrate such as a printed wiring board does not operate in a desired manner, a failure analysis equipment is often used for clearing up the cause thereof and/or identifying a failure site of an electronic circuit.

FIG. 1 illustrates a conventional failure analysis system to be used for identifying a failure site of an electronic circuit. The illustrated failure analysis equipment comprises a constant voltage supply 20 for supplying a constant voltage to an electronic circuit 100 to be failure-analyzed, a test signal emitter 21 for emitting test signals to the target electronic circuit 100, and an in-circuit tester 22 for comparing measured voltages of various sections of the target electronic circuit 100 with a predetermined value to thereby determine voltage and/or current in those sections of the target electronic circuit 100 are normal or abnormal.

In this failure analysis equipment, a constant voltage is applied to the target electronic circuit 100, and then voltages of various sections of the target electronic circuit 100 are measured. Then, the in-circuit tester 22 compares the thus measured voltages with a design value or calculates a current from those voltages to thereby determine whether an abnormal current is running through the target electronic circuit 100 or not. In addition, the in-circuit tester 22 observes response from the target electronic circuit 100 when the test signal emitter 21 emits test signals to the target electronic circuit 100. Thus, failure sites in the target electronic circuit 100 are identified, and the causes of failures are investigated.

FIG. 2 illustrates another example of a conventional failure analysis equipment. The illustrated failure analysis equipment is to be used only for an analog integrated circuit. A pair of probes 23 are made in physical contact with an integrated circuit chip 24 mounted on an analog integrated circuit device 100 to be failure-analyzed. The probes 23 are in electrical communication with a detector 25, and thus the detector 25 can measure a voltage of a point of the chip 24 with which the probes 23 are in contact. A device driving system 26 supplies voltage, current and/or signals to and thereby operates the target circuit device 100 for testing.

In operation, the device driving system 26 is driven to test the performance of the integrated circuit device 100. Then, the detector 25 measures a voltage of a point of the chip 24 with which the probes 23 are in contact. Based on the thus measured voltage, it is possible to determine states of a current running through wirings of the integrated circuit device 100. Thus, a failure analysis is made by comparing the thus determined current states with design data, or with an equivalent circuit which normally operates.

In the conventional failure analysis equipment illustrated in FIG. 1, the in-circuit tester 22 measures voltages of many sections of the target electronic circuit 100 for identifying failure sites and the causes of the failure. However, if the target electronic circuit 100 mounts elements thereon in high density, it is often difficult, in some cases maybe impossible, to measure a voltage of a target point due to such elements mounted with high density. In addition, since wirings mounted on a substrate are covered with a protection film, it is necessary to remove such a protection film in order to measure a voltage of the sections of the target electronic circuit 100. Thus, the conventional failure analysis equipment has a problem that it is impossible to identify failure sites and the causes of failure without direct contact to and damage to the target electronic circuit.

Similarly to the above mentioned conventional failure analysis equipment, the failure analysis equipment illustrated in FIG. 2 has to render the probes 23 in physical contact with the target circuit 100. Hence, with higher integration of an integrated circuit, it is more difficult to put the probes 23 at a desired point in the target circuit 100. In addition, there is a fear that the probes 23 themselves work as a load against the target circuit 100, and may exert a harmful influence on the operation of the target circuit 100. Furthermore, the target circuit 100 may be damaged by putting the probes 23 on the target circuit 100.

A typical failure analysis technique is reported in a paper "A METHOD OF DETECTING HOT SPOTS ON SEMI-CONDUCTORS USING LIQUID CRYSTALS" by John Hiatt in CH 1619-6/81/0000-0130, pp 130–133, 1981, IEEE/PROC. IRPS. This paper reports a failure analysis technique using cholesteric liquid crystals and polarized light to locate areas of high power dissipation on an integrated circuit. According to this paper, the technique is non-destructive and can be performed in a few minutes using common failure analysis equipment. An example is given involving the analysis of a CMOS latch-up mechanism.

SUMMARY OF THE INVENTION

It is an object of the present invention to provide a failure analysis equipment capable of failure-analyzing an electronic circuit without direct contact to the electronic circuit and also without any damage to the electronic circuit, even if the electronic circuit mounts elements thereon in high density. It is also an object of the present invention to provide a method of making a failure analysis for an electronic circuit.

The invention provides a failure analysis equipment to be used for an electronic circuit, including (a) a voltage supply for supplying a constant voltage to a wiring of an electronic circuit to be analyzed, (b) a generator for generating one of an energy beam and a fluid jet, (c) an apparatus for irradiating the an energy beam or fluid jet to the wiring to thereby vary a temperature and hence an electrical resistance of the wiring, (d) a current detector for detecting a current running through the wiring, and (e) a comparator for comparing the current with a current which is to run if no failure exists in the wiring, thereby determining whether the wiring is in failure or not.

The invention further provides a failure analysis equipment to be used for an electronic circuit, including (a) a constant voltage supply for supplying a predetermined constant voltage to an electronic circuit to be analyzed, (b) a test signal transmitter for transmitting test signals to the electronic circuit, (c) an energy beam generator for generating energy beam, (d) an energy beam scanner for arranging the energy beam in desired dimension and shape, and for irradiating the thus arranged energy beam only to a predetermined section of a wiring of the electronic circuit, (e) a current variation detector for detecting variation of a current running through the electronic circuit with the constant voltage supply supplying the predetermined constant voltage to the electronic circuit both when the energy beam is being irradiated to the electronic circuit and when the energy beam is not irradiated to the electronic circuit, (f) a data holder for storing a specification of the electronic circuit therein and outputting certain data among the specification of the electronic circuit, and (g) a controller for receiving data about a variation of the current from the current variation detector and also receiving the certain data from the data holder, and calculating, based on those data, a current running through sections of the wiring to which the energy beam is irradiated, and further controlling the operation of the elements (a) to (f). Herein, the specification of the electronic circuit to be stored in the data holder includes a circuit structure, arrangement of elements, wiring region, material of which a wiring is made, wiring width, and wiring thickness. The energy beam includes laser beam, infrared ray beam, electron beam, corpuscular beam and ion beam.

A fluid jet may be used in place of an energy beam. When a fluid jet is to be used, a fluid jet controller is used in place of the energy beam scanner for arranging the fluid jet in desired dimension, shape and velocity.

The invention still further provides a method of making a failure analysis for an electronic circuit, including the steps of (a) supplying a constant voltage to a wiring of an electronic circuit to be analyzed, (b) generating one of an energy beam and a fluid jet, (c) irradiating the an energy beam or a fluid jet to the wiring to thereby vary a temperature and hence an elecrical resistance of the wiring, (d) detecting a current running through the wiring, and (e) comparing the current with a current which is to run if no failure exists in the wiring, thereby determining whether the wiring is in failure or not.

The failure analysis equipment in accordance with the invention makes it possible to detect and identify failure sites by observing a static current running through wirings of a circuit to be failure-analyzed by means of a physically non-contact process. In general, it is quite difficult or almost impossible to measure a current running through wirings in a circuit without altering a circuit structure. The invention makes such measurement possible by utilizing the principle that a slight variation in electrical resistance of a wiring of a circuit varies a magnitude of a current supplied to that wiring.

In the failure analysis equipment in accordance with the invention, an energy beam or fluid jet is irradiated to a predetermined section of a wiring of a target electronic circuit to thereby vary a temperature and hence an electrical resistance of that section. If an electrical resistance is varied in a certain section of a wiring, a magnitude of a current running through the wiring is also varied. Such variation of a current running through the wiring is detected, and a current running through the wiring is calculated based on such current variation and data about the target electronic circuit which is already known. Then, the thus calculated current is compared to a current running through the same electronic circuit which normally operates, which current is already calculated, or to a design current value. Thus, failure sites in the target electronic circuit and the causes of the failures can be identified.

As mentioned above, the failure analysis equipment in accordance with the invention makes it possible to measure a current running through wirings of a target electronic circuit, and thus also possible to identify failure sites and causes of failures without direct contact with the wirings and destruction of a protection film. In addition, a failure analysis can be readily made even for an electronic circuit having many elements mounted thereon in high density, by sufficiently attenuating a diameter of the energy beam or fluid jet.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings, in which:

FIG. 3 is a block diagram of a failure analysis equipment in accordance with the first embodiment of the invention;

DESCRIPTION OF THE PREFERRED EMBODIMENTS

Figure 1:
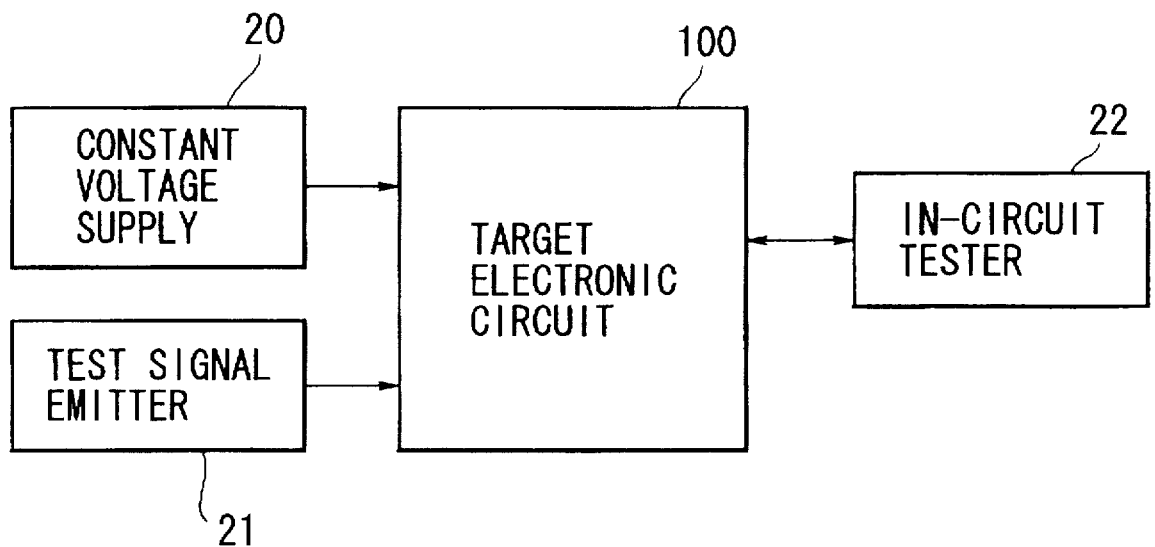
FIG. 1 is a block diagram of a conventional failure analysis equipment to be used for an electronic circuit.
Figure 2:
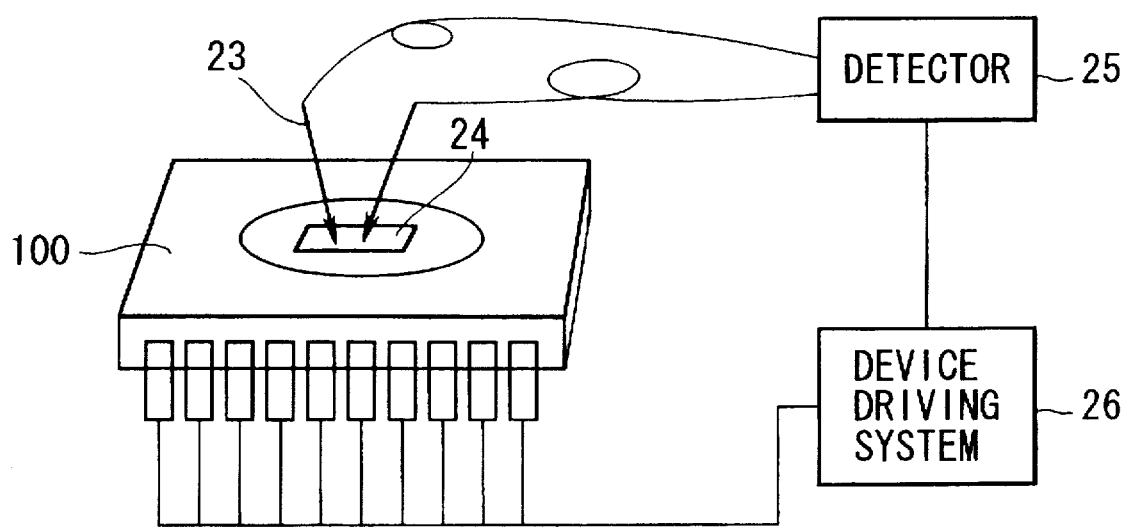
FIG. 2 is a schematic view of another conventional failure analysis equipment to be used for an electronic circuit.

With reference to FIG. 3, a failure analysis equipment in accordance with the first embodiment includes (a) a constant voltage supply 1 for supplying a constant voltage to an electronic circuit 100 to be failure-analyzed, (b) a test signal transmitter 2 for transmitting test signals to the target electronic circuit 100, (c) an an energy beam generator 4 for generating an energy beam under the control of a system controller 7, (d) an the energy beam scanner 5 for arranging the energy beam received from the energy beam generator 4 into a desired dimension and shape, and then irradiating the thus arranged energy beam to a wiring of the target electronic circuit 100, (e) a data holder 6 for storing therein data about the target electronic a circuit 100 such as a circuit structure, arrangement of elements, wiring region, material of which a wiring is made, wiring width and wiring thickness, and outputting one or more of the data as required, (f) a current variation detector 3 for detecting variation of a current running through the target electronic circuit 100 with the constant voltage being supplied to the target electronic circuit 100 both when the energy beam is being irradiated to the target electronic circuit 100 and when the energy beam is not irradiated to the target electronic circuit 100, (g) a system controller 7 for receiving data about a variation of the current from the current variation detector 3 and also receiving data from the data holder 6, and calculating, based on those data, a current running through the wiring to which the energy beam is irradiated. The system controller controls the operation of the above mentioned elements 1–6.

In operation, in accordance with instruction signals transmitted from the system controller 7, the an energy beam generator 4 generates an energy beam such as a laser beam, electron beam, infrared ray, corpuscular beam and ion beam. The intensity of the energy beam is controlled by the energy beam generator 4. The thus generated energy beam is introduced into the energy beam scanner 5. The energy beam scanner 5 sufficiently attenuates the introduced energy beam into a diameter in the range of 0.5 μm to 1 mm. Then, in accordance with instruction signals transmitted from the system controller 7, the energy beam is irradiated from the energy beam scanner 5 to a wiring to be failure-analyzed in the target electronic circuit 100. The irradiation of the energy beam locally raises a temperature of the wiring in the target electronic circuit 100. As a result, an electrical resistance of the wiring is increased.

The constant voltage supply 1 supplies a constant voltage to the target electronic circuit 100. If a current is running through the wiring to which the energy beam has irradiated, a current supplied from the constant voltage supply 1 varies in a magnitude since an electrical resistance of the wiring is increased. The current variation detector 3 detects such variation of the current supplied from the constant voltage supply 1, and amplifies it. The thus amplified variation of the current is transmitted to the system controller 7. The system controller 7 receives data such as energy beam intensity and a period of time for irradiation of the energy beam from the energy beam generator 4, and also receives data about the target electronic circuit 100 from the data holder 6, such as a circuit structure, material of which a wiring is made, width and tickness of a wiring and material of which a substrate is made. Based on those data, the system controller 7 processes data about variation of the current supplied from the constant voltage supply 1 to thereby calculate a current running through the wiring to which the energy beam had irradiated.

The thus calculated current running through a wiring in the target electronic circuit 100 is compared with a current running through the same wiring in the same electronic circuit which normally operates, or with a design current value. Such comparison enables to readily find failure sites by which the wiring cannot operate normally without direct contact to and destruction of the wiring. In addition, by attenuating the energy beam into a sufficiently small diameter, a failure analysis can be readily made even for a substrate on which elements and wirings are mounted in high density.

Figure 4:
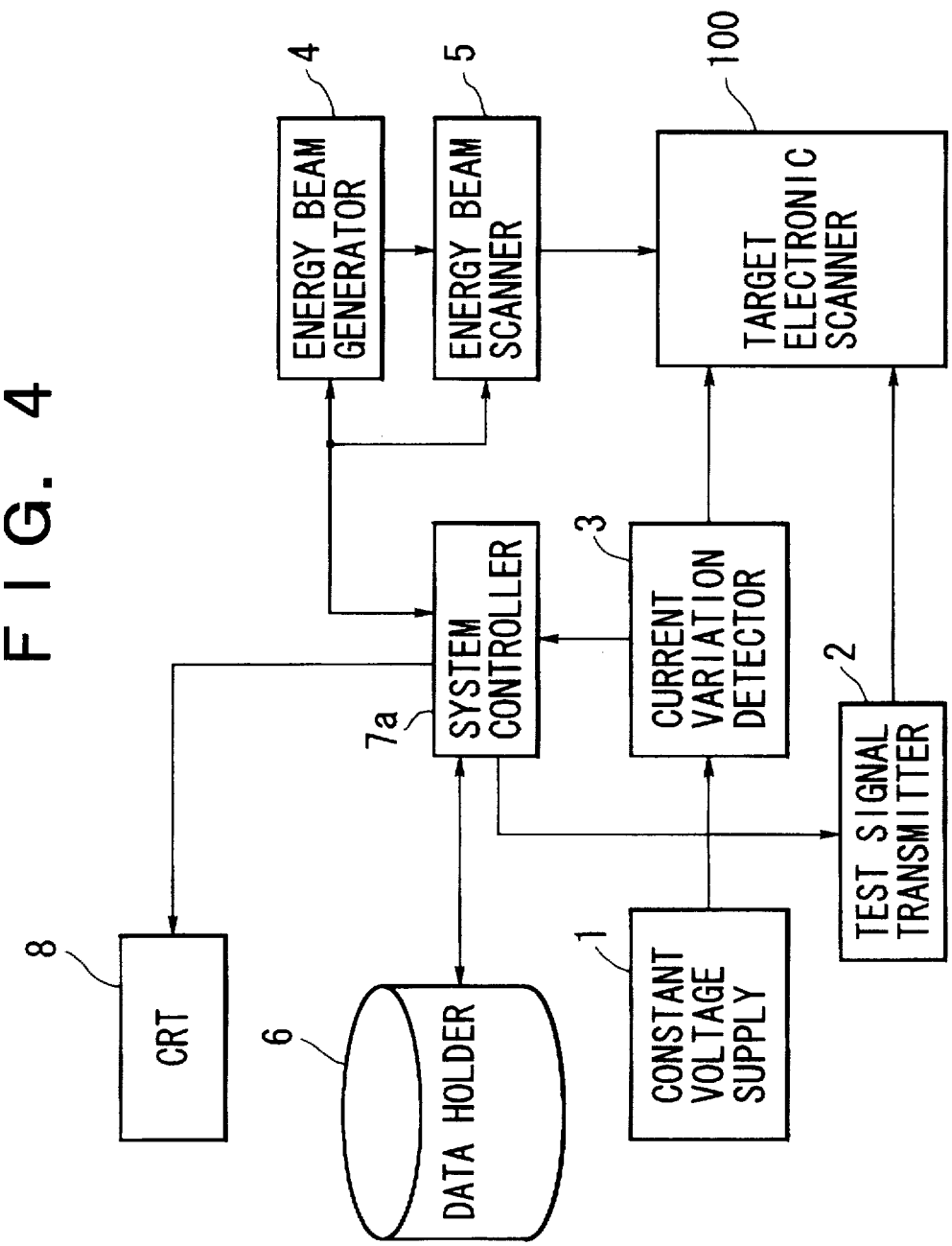
FIG. 4 is a block diagram of a failure analysis equipment in accordance with the second embodiment of the invention.

FIG. 4 illustrates a failure analysis equipment in accordance with the second embodiment of the invention. The second embodiment is almost similar to the first embodiment, but is different in the following two points. First, the second embodiment is provided with a system controller 7a in place of the system controller 7 in the first embodiment. The system controller 7a in the second embodiment has a circuit for outputting calculation results of a current running through wirings to which the energy beam is irradiated in the target electronic circuit. Second, the second embodiment is provided with a CRT (cathode ray tube) 8 which displays a luminance profile corresponding to the calculation results of the current running through the wirings to which the energy beam is irradiated.

The system controller 7a receives data about energy beam irradiation from the energy beam generator 1 and the energy beam scanner 2, and sends luminance signals to the CRT 8. The luminance signals represent luminance corresponding to current variation for each of the wirings of the target electronic circuit 100. When the energy beam is irradiated to a wiring through which a current is running, a current supplied to the target electronic circuit 100 varies. On the other hand, when the energy beam is irradiated to a wiring through which a current is not running, a current supplied to the target electronic circuit 100 does not vary. Thus, only wirings through which a current is running are displayed on the CRT 8.

Failure analysis can be made for the target electronic equipment 100 by using the failure analysis equipment in accordance with the embodiment as follows. The invention makes it possible to find in which wiring a current runs in the target electronic circuit 100. Thus, by comparing such a current with a current which is to run through the same wiring of the target electronic circuit which normally operates, failure sites in the target electronic device 100 can be found. In the alternative, a current running through a wiring of the same target electronic circuit which normally operates is measured under the same conditions, and the thus measured current may be compared with measurement results of an electronic circuit in failure. Such comparison is made between a design value and a measured value, or between a current of a normal circuit and a current of an abnormal circuit, and thus is quite simple. Hence, failure analysis can be made in a short period of time. In addition, the failure analysis equipment in accordance with the invention is quite simple in structure, because the failure analysis equipment is characterized by irradiation and scanning of the energy beam relative to the prior failure analysis equipment.

Figure 5:
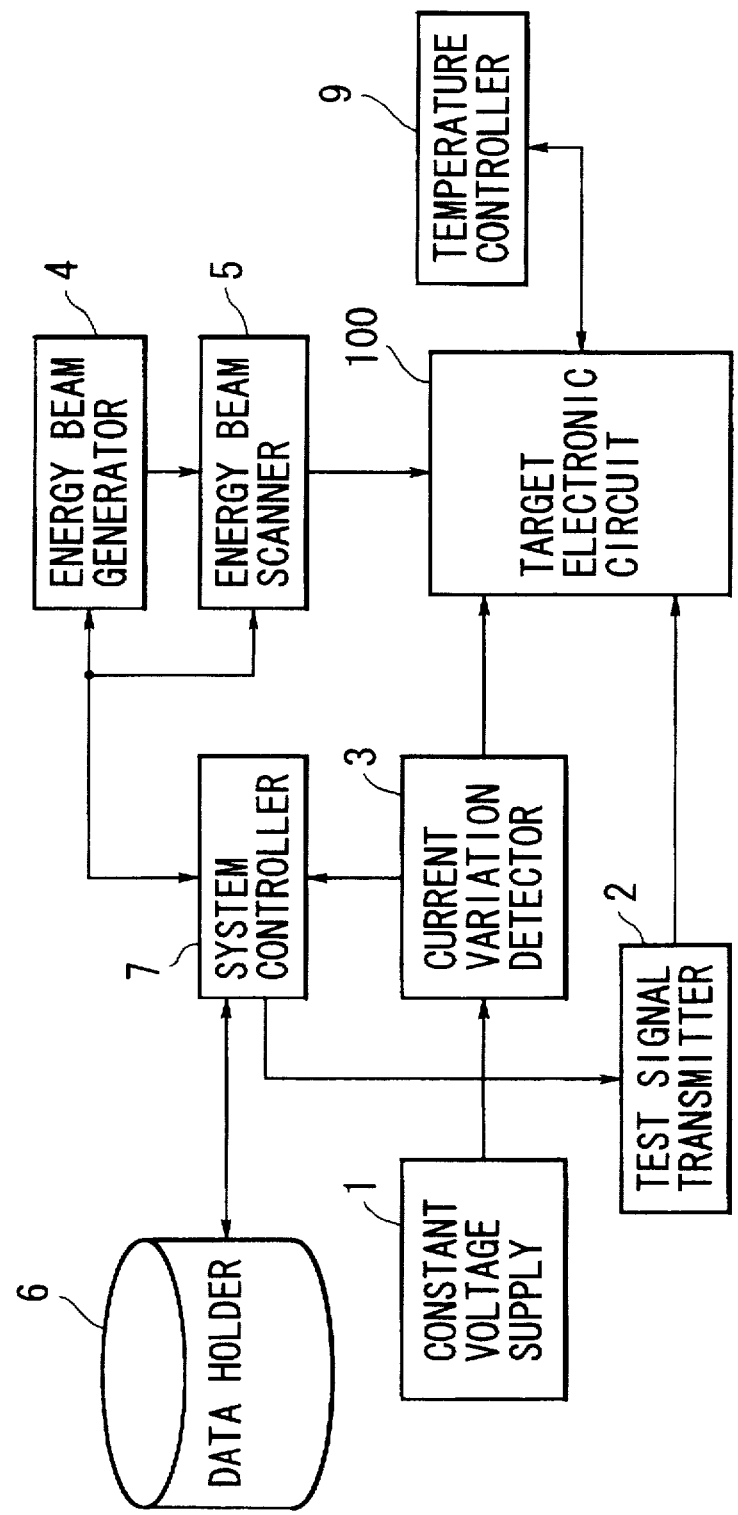
FIG. 5 is a block diagram of a failure analysis equipment in accordance with the third embodiment of the invention.

FIG. 5 illustrates a failure analysis equipment in accordance with the third embodiment of the present invention. The third embodiment is almost similar to the first embodiment, but is different only in that the third embodiment is additionally provided with a temperature controller 9 which keeps a temperature of regions to which the energy beam is not irradiated to be constant. By keeping the regions, to which the energy beam is not irradiated, to be at a constant temperature, it is possible to enhance the accuracy for detecting the current variation and hence the accuracy of failure analysis.

Figure 6:
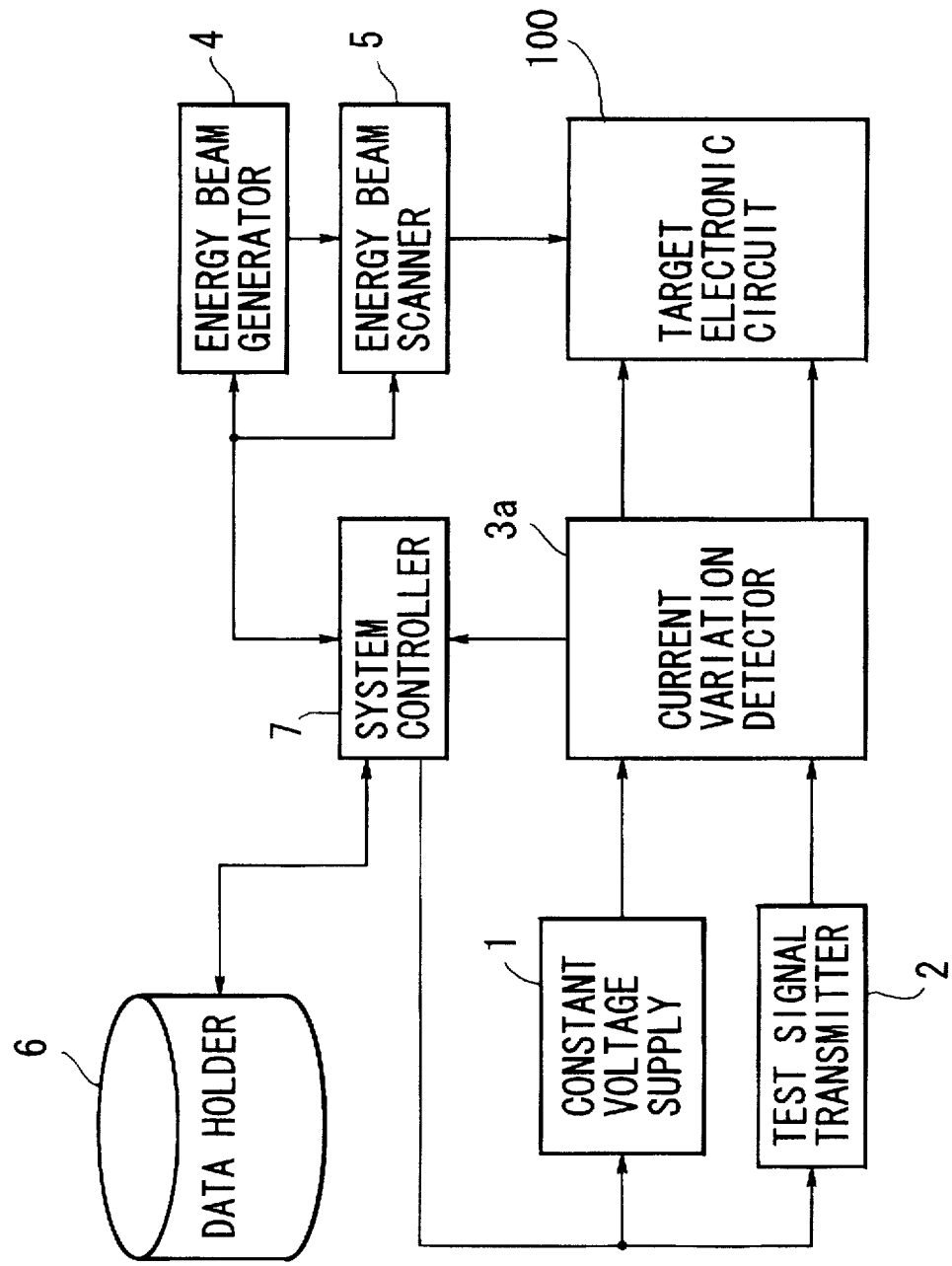
FIG. 6 is a block diagram of a failure analysis equipment in accordance with the fourth embodiment of the invention.

FIG. 6 illustrates a failure analysis equipment in accordance with the fourth embodiment of the present invention. The fourth embodiment is almost similar to the above mentioned first to third embodiments in which test signals are transmitted from the test signal transmitter 2 directly to the target electronic circuit 100, but is different in that test signals transmitted from the test signal transmitter 2 are transmitted to the target electronic circuit 100 through a current variation detector 3a. The current variation detector 3a monitors variation of a current of test signals, and provides data about such variation of the test signals current to the system controller 7 along with data about variation of a current supplied from the constant voltage supply 1. The system controller 7 calculates a current running through a certain wiring based on the thus supplied data.

Figure 7:
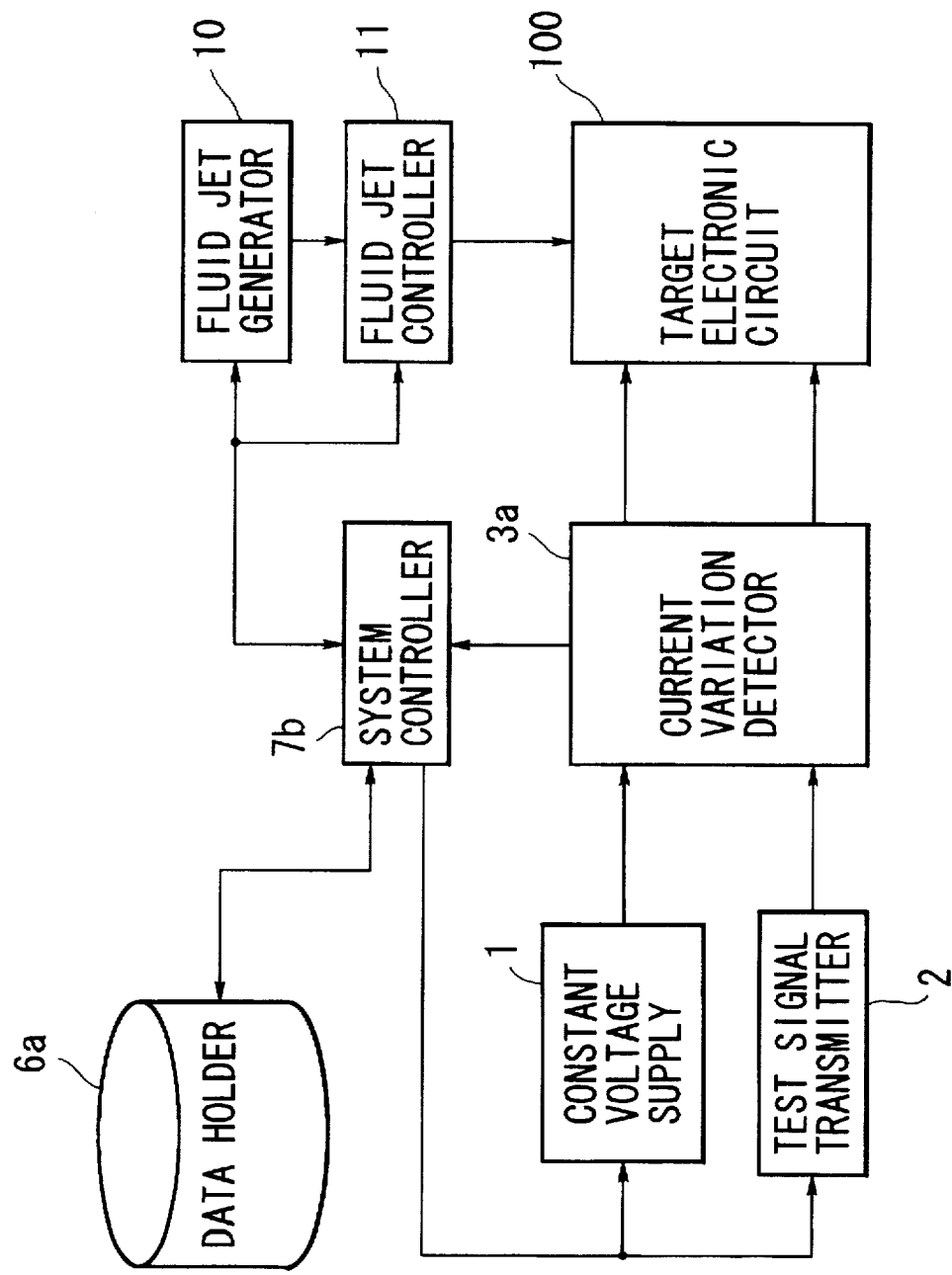
FIG. 7 is a block diagram of a failure analysis equipment in accordance with the fifth embodiment of the invention.

FIG. 7 illustrates a failure analysis equipment in accordance with the fifth embodiment of the present invention. The fifth embodiment is different from the first embodiment (FIG. 3) in that the fifth embodiment is provided with a fluid jet generator 10 for generating a certain fluid jet, and a fluid jet controller 11 in place of the energy beam generator 4 and the energy beam scanner 5. The fluid jet controller 11 arranges fluid jet generated at the fluid jet generator 10 into a desired dimension, shape and velocity, and irradiated the thus arranged fluid jet to a predetermined region of the target electronic circuit 100. A system controller 7b substituted for the system controller 7a controls the operation of the parts 1, 2, 6a, 10 and 11, and calculates a current running through a wiring of the target electronic circuit 100.

In operation, the fluid jet generator 10 pressurizes fluid such as gas, liquid and a mixture thereof to spurt out the fluid through a thin nozzle in accordance with an instruction signal transmitted from the fluid jet generator 10. Thus, there is obtained a thin, high-speed fluid jet. The thus formed fluid jet is introduced into the fluid jet controller 11, and is stabilized with respect to a speed in in the range of 10 cm/s to 100 m/s. A diameter of the fluid jet is arranged in the fluid jet controller 11 to be in the range of 50 µm to 1 mm. The speed and shape of the fluid jet is dependent on material of which the fluid jet is composed, namely gas such as nitrogen, argon and air or liquid such as water, alcohol and organic solvent, and further dependent on diameter and density of a wiring of the target electronic circuit 100, and material of which a wiring of the target electronic circuit 100 is made. These data are provided to the fluid jet controller 11 from the system controller 7b.

The fluid jet is irradiated to a target region of the target electronic circuit 100 in accordance with instructions transmitted from the system controller 7b. Herein, a target region is defined as follows: current variation which occurs in "a target region" is intended to be detected. The irradiation of the fluid jet locally varies a temperature of the target region of the target electronic circuit 100. For instance, the irradiation of the fluid jet consisting of liquid having a lower temperature than that of the target region of the target electronic circuit 100 lowers a temperature of the target region, which is further lowered by heat of vaporization of the liquid. On the other hand, the irradiation of the fluid jet consisting of gas having a lower temperature than that of the target region of the target electronic circuit 100 lowers a temperature of the target region, while the irradiation of the fluid jet consisting of gas having a higher temperature than that of the target region of the target electronic circuit 100 raises a temperature of the target region. Such variation of a temperature of the target region causes electrical resistance of a wiring including the target region to be slightly varied. Specifically, in general, local temperature raise-up of a wiring increases electrical resistance of the wiring, while local temperature drop of a wiring decreases electrical resistance of the wiring.

The constant voltage supply 1 supplies constant voltage to the target electronic circuit 100 through the current variation detector 3a. The test signal transmitter 2 produces test signals with which the target electronic circuit 100 are to be tested, and supplied the produced test signals to the target electronic circuit 100 through the current variation detector 3a. The currents supplied from the constant voltage supply 1 and test signal transmitter 2 are monitored by the current variation detector 3a. When a current runs through a wiring to which the fluid jet has irradiated, the electrical resistance of the wiring is slightly varied by the irradiation of the fluid jet, resulting in that a current supplied to the target electronic circuit 100 from the constant voltage supply 1 is varied. The current variation detector 3a detects such variation of the current, and transmits data about the variation to the system controller 7b. The data holder 6a stores data about the target electronic circuit 100 such as circuit structure, element information, width and thickness of wirings, and material of which a wiring and a substrate are made, and provides certain data among them with the system controller 7b in accordance with requirements of the system controller 7b. The system controller 7b receives data from the data holder 6a, data about current variation from the current variation detector 3a, and data about flow rate, flow speed, and temperature of the fluid jet, a period of time for irradiation of the fluid jet, and shape of the fluid jet from the fluid jet generator 10 and the fluid jet controller 11, and, based on the received data, calculates a current running through a wiring to which the fluid jet has irradiated in the target electronic circuit 100.

The thus calculated current running through the fluid jet irradiated wiring in the target electronic circuit 100 is compared with a current which is to run through the same wiring in the same electronic circuit which normally operates, or with a design current. Thus, failure sites can be detected in the target electronic circuit 100.

Figure 8:
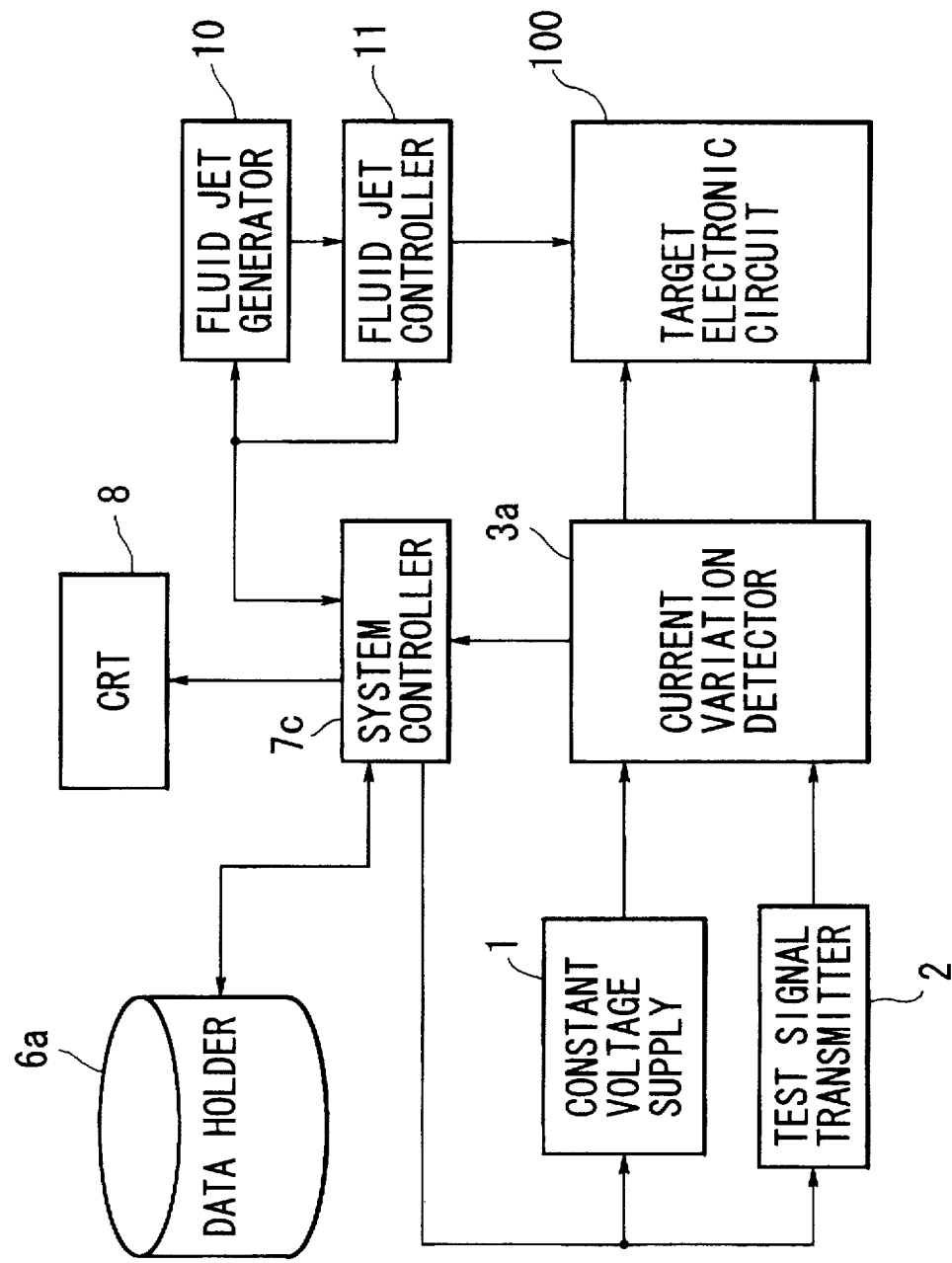
FIG. 8 is a block diagram of a failure analysis equipment in accordance with the sixth embodiment of the invention.

FIG. 8 illustrates a failure analysis equipment in accordance with the sixth embodiment of the invention. The illustrated failure analysis equipment includes the same structure as that of the failure analysis equipment in accordance with fifth embodiment illustrated in FIG. 7, and is additionally provided with the CRT 8 as included in the failure analysis equipment in accordance with the second embodiment illustrated in FIG. 4. The CRT 8 in the sixth embodiment has the same structure and function as that of the CRT in the second embodiment.

Figure 9:
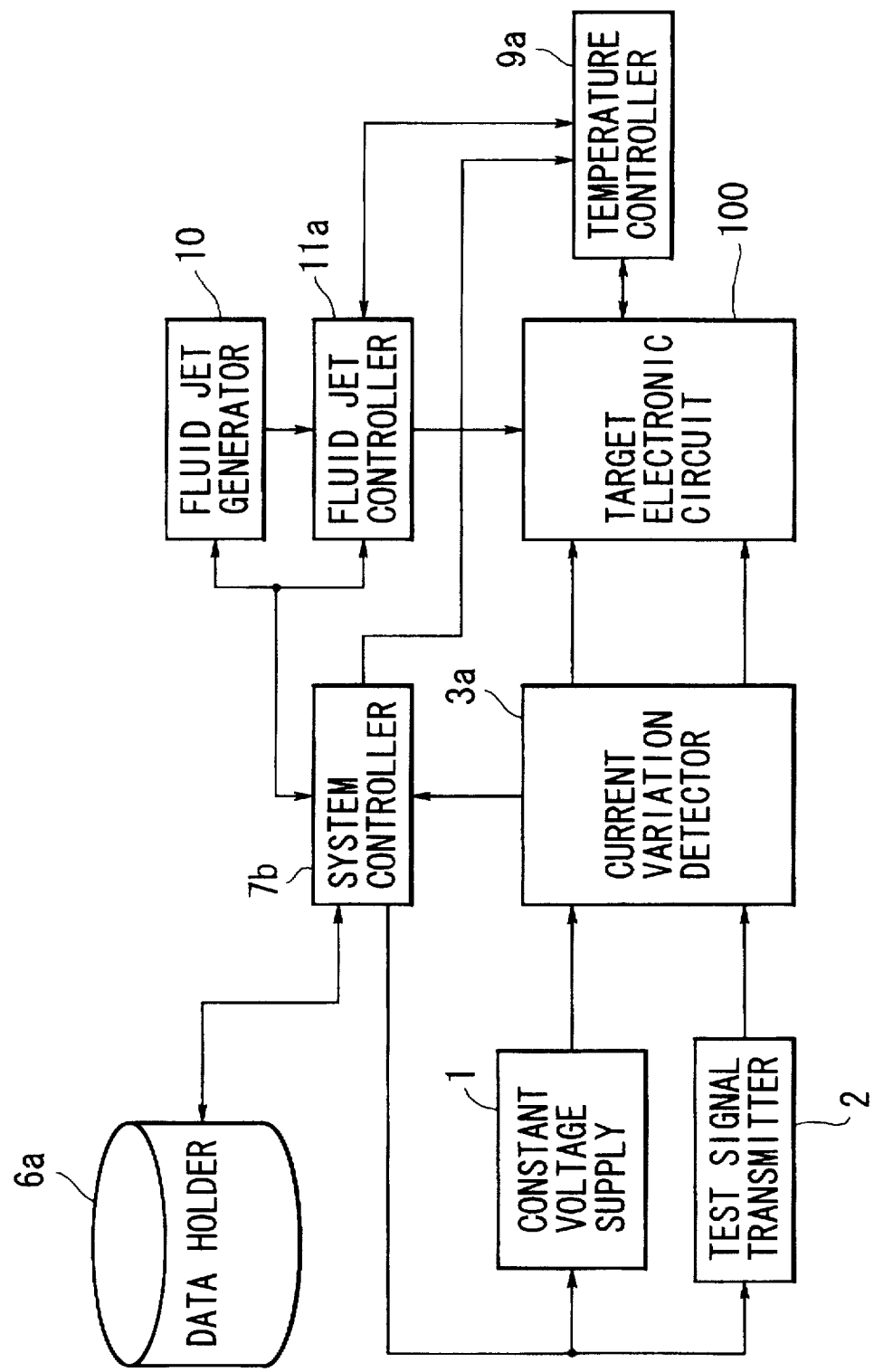
FIG. 9 is a block diagram of a failure analysis equipment in accordance with the seventh embodiment of the invention.

FIG. 9 illustrates a failure analysis equipment in accordance with the seventh embodiment of the present invention. The illustrated failure analysis equipment includes the same structure as that of the fifth embodiment illustrated in FIG. 7, and is additionally provided with a temperature controller 9a. The temperature controller 9a keeps a temperature of regions to which the fluid jet is not irradiated to be constant, and further keeps a temperature of the fluid jet to be at a predetermined value.

In this embodiment, the temperature controller 9a keeps a temperature of the fluid jet in the fluid jet controller 11a in the range of −200 to 300 degrees centigrade in accordance with instruction signals transmitted from the system controller 7b, and further keeps a temperature of the target electronic circuit 100 to be constant in the range of −50 to 200 degrees centigrade. The invention utilizes variation of an electrical resistance of a wiring caused by variation of a temperature of the wiring. By keeping the target electronic circuit 100 and the fluid jet to be at a constant temperature while an electrical resistance of a wiring is being measured, it is possible to remove noise caused by temperature variation in measuring environment, and hence possible to take highly accurate measurement with low noise with the result of accurate and detailed failure analysis.

Figure 10:
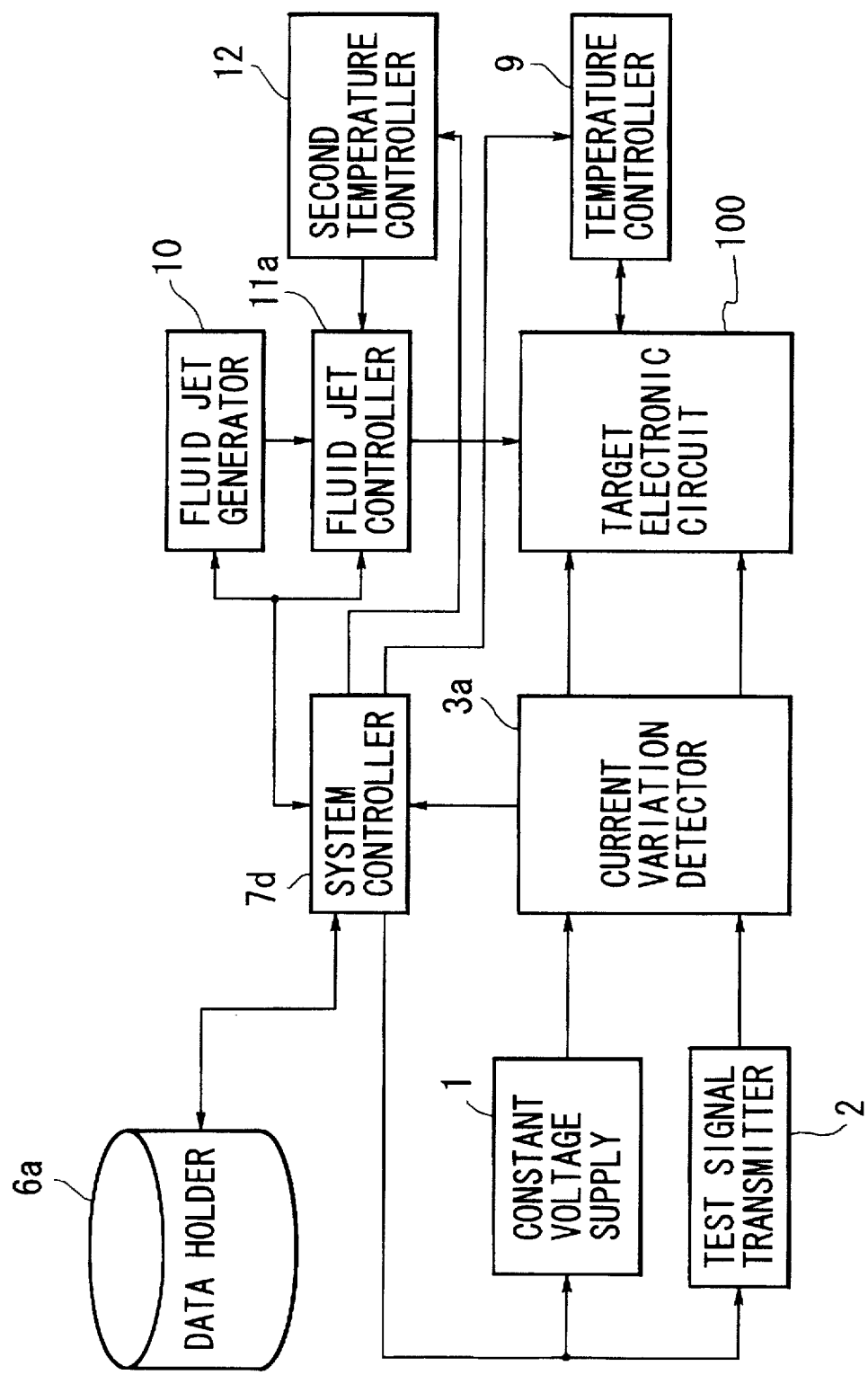
FIG. 10 is a block diagram of a failure analysis equipment in accordance with the eighth embodiment of the invention.

FIG. 10 illustrates a failure analysis equipment in accordance with the eighth embodiment of the invention. The illustrated failure analysis equipment includes the same structure as that of the ninth embodiment illustrated in FIG. 9, and is additionally provided with a second temperature controller 12. In this embodiment, the temperature controller 9 keeps the target electronic circuit 100 at a constant temperature, while the second temperature controller 12 controls a temperature of the fluid jet.

In this embodiment, the second temperature controller 12 controls a temperature of the fluid jet on a time basis to thereby amplify temperature variation of a wiring to which the fluid jet is irradiated. For instance, the fluid jet having a high temperature is irradiated in a certain period of time, and then the fluid jet having a low temperature is irradiated in a certain period of time. This operation is defined as an operation A. In the alternative, the fluid jet having a low temperature is irradiated in a certain period of time, and then the fluid jet having a high temperature is irradiated in a certain period of time. This operation is defined as an operation B. By carrying out either the operation A or B, it is possible to obtain greater temperature variation of a wiring to which the fluid jet is irradiated than temperature variation of a wiring to which the fluid jet which is kept at a constant temperature is irradiated. The greater temperature variation of a wiring produces greater variation in an electrical resistance of the wiring and hence greater variation in a current running through the wiring, which makes it possible to make failure analysis with high accuracy.

The operation A or B may be repeated, or the operations A and B may be alternately repeated, which provides greater temperature variation of a wiring to which the fluid jet is irradiated than temperature variation of a wiring to which the fluid jet which is kept at a constant temperature is irradiated, and which further provides a plurality of cyclic temperature variation. The increased number of measurement makes it possible to make failure analysis with higher accuracy than failure analysis to be made with single operation A or B.

Figure 11:
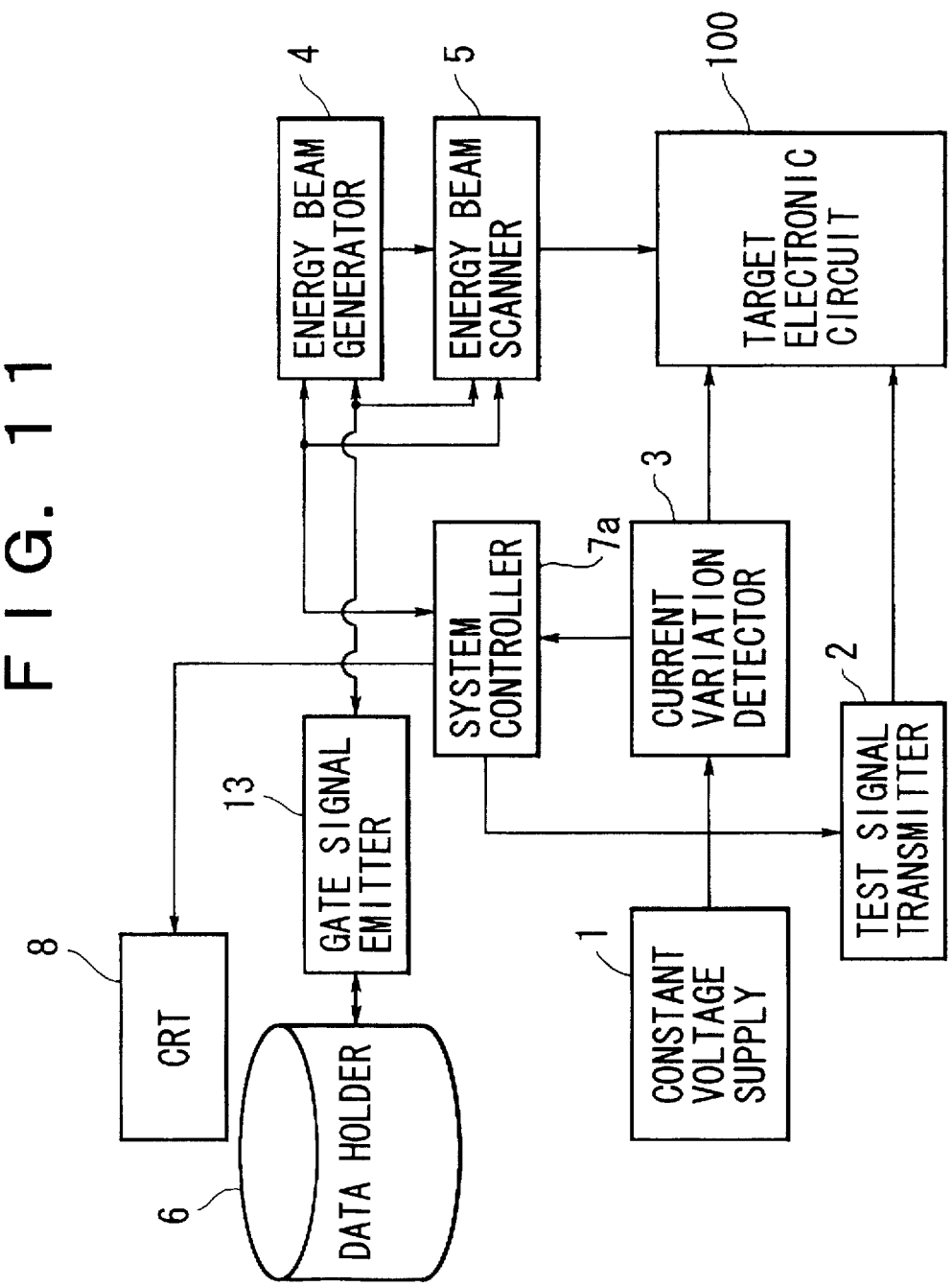
FIG. 11 is a block diagram of a failure analysis equipment in accordance with the ninth embodiment of the invention.

FIG. 11 illustrates a failure analysis equipment in accordance with the ninth embodiment of the present invention. In the illustrated failure analysis equipment, the data holder 6 is in electrical connection with a gate signal emitter 13 which is in turn in electrical connection with the energy beam generator 4 and the energy beam scanner 5. The gate signal emitter 13 receives data as to where wirings of the target electronic circuit 100 are from the data holder 6, and further receives data as to where the energy beam is irradiated from the energy beam scanner 5. Then, the gate signal emitter 13 transmits gate signals to the energy beam generator 1. In accordance with the gate signals, the energy beam generator 1 irradiates the energy beam or stops irradiating of the energy beam, and further controls the intensity of the energy beam so that the energy beam is irradiated only to wirings on the target electronic circuit 100. By irradiation of the energy beam only to wirings, it is possible to prevent noise caused by irradiation of the energy beam to regions in which there are not wirings from affecting measurement of the current variation. Thus, it is possible to measure current variation with a high S/N (signal/noise) ratio.

Figure 12:
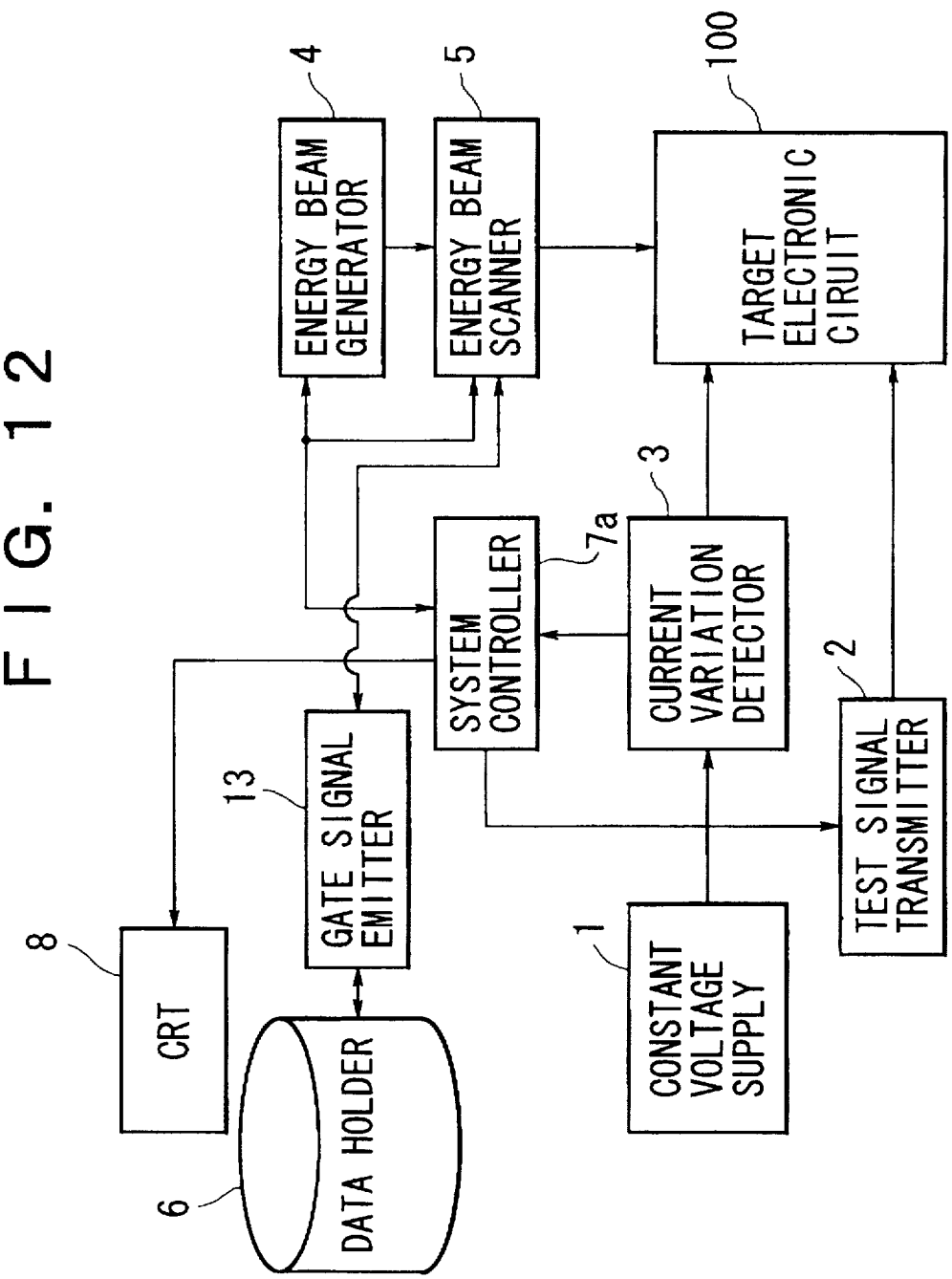
FIG. 12 is a block diagram of a failure analysis equipment in accordance with the tenth embodiment of the invention.

FIG. 12 illustrates a failure analysis equipment in accordance with the tenth embodiment of the present invention. In the illustrated failure analysis equipment, the gate signal emitter 13 is in electrical connection with the data holer 6, and further with both the energy beam scanner 5 and the system controller 7a. The gate signal emitter 13 receives data as to where wirings of the target electronic circuit 100 are from the data holder 6, and further receives data as to where the energy beam is irradiated from the energy beam scanner 5. The gate signal emitter 13 transmits a gate signal to the system controller 7a. In accordance with the gate signal, the system controller 7a processes the variation of a current supplied to the target electronic circuit 100 which variation is to occur when the energy beam is irradiated to wirings of the target electronic circuit 100, and does not process the variation of the current which is to occur when the energy beam is irradiated to regions in which there are not wirings. Thus, the failure analysis equipment in accordance with the embodiment makes it possible to measure the current variation with smaller noise because of removal of noise caused by variation of a current supplied to the target electronic circuit which variation occurs when the energy beam is irradiated to regions in which no wirings exist.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A failure analysis equipment for an electronic circuit, comprising:

(a) a voltage source for supplying a voltage to a wiring of a circuit to be analyzed;

(b) an energy beam irradiator for irradiating an energy beam to said wiring to vary an electrical resistance of said wiring;

(c) a current detector for detecting a difference between a first current running when said energy beam is irradiated to said wiring and a second current running when said energy beam is not irradiated to said wiring, and for producing first data indicative of said difference;

(d) a data holder for storing second data indicative of said wiring; and (e) a controller for responding to said first and second data, and calculating a third current actually running through said wiring to determine whether said wiring is in failure.

2. The failure analysis equipment as claimed in claim 1, wherein said controller further responds to third data indicative of said energy beam to calculate said third current.

3. The failure analysis equipment as claimed in claim 1, further comprising a temperature controller for controlling a temperature of a portion of said circuit.

4. The failure analysis equipment as recited in claim 1, wherein said energy beam comprises one of a laser beam, an infrared ray beam, an electron beam, a corpuscular beam, and an ion beam.

5. The failure analysis equipment as recited in claim 1, further comprising:

(j) a current-luminance convertor for converting currents running through sections of said wiring to which one of said energy beam is irradiated into luminance in accordance with a magnitude of said current; and (k) a display for displaying said luminance thereon.

6. The failure analysis equipment as claimed in claim 1, wherein said controller further responds to third data indicative of said energy beam to calculate said third current, and wherein said failure analysis equipment further comprises a temperature controller for controlling a temperature of a portion of said circuit.

* * * * *